United States Patent [19]
Kurahashi

[11] Patent Number: 6,165,809
[45] Date of Patent: Dec. 26, 2000

[54] METHOD OF FABRICATING LIGHT EMITTING DIODES

[75] Inventor: Takahisa Kurahashi, Nara, Japan

[73] Assignee: Sharp Kabushiki Kaisha, Osaka, Japan

[21] Appl. No.: 09/241,476

[22] Filed: Feb. 2, 1999

[30] Foreign Application Priority Data

Feb. 10, 1998 [JP] Japan .................................. 10-028784

[51] Int. Cl.$^7$ .................................................. H01L 21/00
[52] U.S. Cl. .................................................. 438/29
[58] Field of Search .................................. 438/29, 31, 39, 438/41, 46, 47, 493, 494, 965, 968; 257/94, 95, 96, 97, 98, 99, 101, 102, 103; 372/45, 46, 47

[56] References Cited

U.S. PATENT DOCUMENTS

| | | |
|---|---|---|
| 3,900,863 | 8/1975 | Kim . |
| 5,506,423 | 4/1996 | Saeki .......................................... 257/97 |
| 5,565,694 | 10/1996 | Huang et al. .............................. 257/97 |

FOREIGN PATENT DOCUMENTS

| | | |
|---|---|---|
| 0 423 772 A2 | 4/1991 | European Pat. Off. . |
| 44 33 867 A1 | 6/1995 | Germany . |
| 6-177420 | 6/1994 | Japan . |
| 7-326815 | 12/1995 | Japan . |
| 9-74221 | 3/1997 | Japan . |

*Primary Examiner*—Charles Bowers
*Assistant Examiner*—Keith Christianson
*Attorney, Agent, or Firm*—Nixon & Vanderhye P.C.

[57] ABSTRACT

According to a light emitting diode fabricating method, when a top surface of an n-type GaAs substrate is inclined at an angle θ with respect to a (1 0 0) plane, a front electrode is formed on a surface shaped portion of a current diffusing layer of a thickness of 'd', the surface shaped portion reflecting a shape of a current blocking portion, in a displaced manner by an amount of approximately d/tan θ from in a direction opposite to a direction in which the surface shaped portion has been displaced with respect to the current blocking portion. Thus, the front electrode is formed in a correct position over the current blocking portion.

18 Claims, 16 Drawing Sheets

METHOD OF FABRICATING LIGHT EMITTING DIODES

BACKGROUND OF THE INVENTION

The present invention relates to a method for fabricating light emitting diodes to be used for display, transmission or the like.

Nowadays, light emitting diodes are widely used for optical communications, information display panels and so on. It is important that the light emitting diodes used for these purposes have a high luminance. The luminance, or the efficiency of such a light emitting diode depends on an internal quantum efficiency and an outward emission efficiency. Among these, the outward emission efficiency is largely influenced by the element structure. To improve the outward emission efficiency, a current blocking layer is formed directly below a bonding pad with a view to suppressing an ineffective emitted light that does not go outside due to blockage by the bonding pad or with a view to reducing an emitted light that is totally reflected on a surface of the light emitting diode.

One of known light emitting diodes designed to suppress the above-mentioned ineffective emitted light has a structure shown in FIG. 15. This light emitting diode is formed by stacking an n-type layer 62, a light emitting layer 63, a p-type layer 64, p-type current diffusing layers 65 and 66, and an electrode 68 on a front surface of an n-type GaAs semiconductor substrate 61, and another electrode 67 on a rear surface of the substrate 61. Further, an n-type current blocking layer 69 is formed in the p-type current diffusing layer 66 directly below the front electrode 68. This n-type current blocking layer 69 makes it difficult for a current to flow directly below the front electrode 68, thereby suppressing generation of the ineffective emitted light that is hindered from going outside by the front electrode 68.

On the other hand, a known method for reducing the emitted light that is totally reflected adopts a technique of roughing the surface of the light emitting diode or forming a mesa-shaped portion on the surface of the light emitting diode so as to allow light to be emitted only from directly below the mesa-shaped portion. Examples of the light emitting diode formed with such a mesa-shaped portion are shown in FIG. 16 and FIG. 17. The light emitting diode shown in FIG. 16 is constructed of an n-type layer 71, a light emitting layer 72, a p-type layer 73, a p-type current diffusing layer 74, an n-type current blocking layer 75, a mesa-shaped p-type cladding layer 76, a p-type contact layer 77, a front electrode 78, and a rear electrode 79 which are formed on an n-type GaAs semiconductor substrate 70. The n-type current blocking layer 75 serves to limit the emission of light to a portion directly below the p-type cladding layer 76 to thereby improve the outward emission efficiency.

In regard to the light emitting diode of FIG. 17, the same components as those of the light emitting diode of FIG. 16 are denoted by the same reference numerals, and no description is provided for them. Similar to the light emitting diode of FIG. 16, this light emitting diode suppresses the ineffective, or invalid emitted light below the front electrode 78 by limiting the light emission to a portion directly below the mesa-shaped p-type cladding layer 76 defined by the current blocking layer 75 and forming the electrode 78 on the current blocking layer 75 in a position where no mesa-shaped p-type cladding layer 76 exists.

The light emitting diode of FIG. 15 has a problem that the total reflection of the emitted light is not suppressed. Furthermore, if a substrate with an inclined surface is used as the semiconductor substrate 61, assuming that the current diffusing layer 66 consists of an $Al_xGa_yIn_{1-x-y}P$ ($0 \leq x \leq 1$, $0 \leq y \leq 1$) film, then a shape reflecting the current blocking layer 69 appears on a surface of the film in a displaced position due to a slow growth rate on a (1 0 0) plane of the crystal. Then, assuming that the angle of inclination of the semiconductor substrate 61 is θ and that the thickness of the current diffusing layer 66 is d, then the amount of displacement becomes d/tan θ. Therefore, if the current diffusing layer 66 formed is thick, then the displacement of the upper electrode 68 from the current blocking layer 69 cannot be ignored, resulting in a reduced outward emission efficiency. For example, if the top surface of the semiconductor substrate 61 is inclined at an angle of 15° in a [0 1 1] direction with respect to the (1 0 0) plane and the thickness of the current diffusing layer 66 is 7 μm, then the difference in position between the current blocking layer 69 and the electrode 68 becomes 26 μm. Therefore, considering the fact that the size of the electrode 68 is normally 100 μmφ to 120 μmφ, the difference in position between the current blocking layer 69 and the electrode 68 is equivalent to about one fourth of the size of the electrode 68.

In the light emitting diode shown in FIG. 16, the p-type cladding layer (current diffusing layer) 76 has a mesa-like shape. Therefore, the total reflection of the emitted light on the surface is suppressed, whereas suppression of the ineffective emission under the front electrode 78 is not achieved. Furthermore, etching of the current blocking layer 75 and etching of the p-type cladding layer 76 for the formation of the mesa-like shape must be performed separately. Thus, the fabricating process becomes complicated.

In the light emitting diode shown in FIG. 17, both the total reflection of the emitted light and the ineffective emitted light under the front electrode 78 are suppressed. However, similarly to the light emitting diode of FIG. 16, etching of the current blocking layer 75 and etching of the p-type cladding layer 76 for the formation of the mesa-like shape must be performed separately, and this leads to the problem that the fabricating process becomes complicated.

SUMMARY OF THE INVENTION

Accordingly, the object of the present invention is to provide a method for fabricating a light emitting diode capable of suppressing both the total reflection of the emitted light and the ineffective emission under the front electrode and simplifying the fabricating process.

The above object is achieved by a light emitting diode fabricating method comprising the steps of:

forming a light emitting layer over a top surface of a semiconductor substrate of a first conductive type, the top surface being inclined at a specified angle θ (θ>0) with respect to a (1 0 0) plane, and then forming a current blocking layer of the first conductive type over the light emitting layer;

partially removing the current blocking layer, wherein the current blocking layer that remains includes one or more current blocking portions;

forming an $Al_xGa_yIn_{1-x-y}P$ ($0 \leq x \leq 1$, $0 \leq y \leq 1$) current diffusing layer of a second conductive type to a specified thickness 'd' over the remaining current blocking layer and the light emitting layer, wherein the current diffusing layer has one or more shaped portions reflecting a shape of the remaining current blocking layer in a position displaced with respect to the remaining current blocking layer in a first direction and in parallel with a surface of the remaining current blocking layer; and forming an electrode on a surface of the one or each shaped portion corresponding to the one or each current blocking portion in a displaced manner by 0.5×(d/tan θ) to 1.5×(d/tan θ) in a second direction opposite to the first direction for compensating the displacement in the first direction of the one or each shaped portion.

According to the light emitting diode fabricating method of the present invention, the electrode, namely a front electrode, can be formed in an appropriate position just above the current blocking layer even though the top surface of the semiconductor substrate is inclined with respect to the (1 0 0) plane, so that the function of the current blocking layer of suppressing the ineffective emitted light just below the front electrode can be stably obtained.

In an embodiment of the invention, the step of partially removing the current blocking layer uses a removal pattern having one or more current blocking portion patterns and a first alignment pattern to thereby leave the one or more current blocking portions and a first alignment portion on or above the light emitting layer. On the other hand, the step of forming an electrode uses an electrode forming pattern having one or more electrode patterns and a second alignment pattern, and forms one or more electrodes by aligning the second alignment pattern with the shaped portion of the current diffusing layer that reflects a shape of the first alignment pattern. A position of the second alignment pattern relative to the one or more electrode patterns in the electrode forming pattern is displaced in the first direction by 0.5×(d/tan θ) to 1.5×(d/tan θ) from a position of the first alignment pattern relative to the one or more current blocking portion patterns in the removal pattern. Therefore, by aligning the second alignment pattern with the shaped portion of the current diffusing layer that reflects a shape of the first alignment pattern, the one or more electrode patterns of the electrode forming pattern are each made to be positioned just above the associated current blocking portion.

As a result, the front electrode can be correctly formed in an appropriate position above the corresponding current blocking portion even though the top surface of the semiconductor substrate is inclined with respect to the (1 0 0) plane.

In one embodiment, the current blocking layer is removed such that the one or each current blocking portion has a dimension in the second direction larger than that of the corresponding electrode by 0.5×(d/tan θ) to 1.5×(d/tan θ). Then, the electrode is formed such that an end in the second direction of the electrode generally coincides with an end in the second direction of the shaped portion of the current diffusing layer reflecting a shape of the corresponding current blocking portion.

In this embodiment, merely aligning the end of the one or each electrode with the end of the corresponding current blocking portion allows an image of the one or each electrode projected on the remaining current blocking layer to be prevented from jutting out of the corresponding current blocking portion. Therefore, this embodiment can easily form the one or more electrodes just above the current blocking layer with high accuracy. Also, there is no need of providing a pattern to be used exclusively as an alignment pattern, thereby allowing the yield to be improved.

In one embodiment, in the step of removing a current blocking layer, a plurality of portions of the current blocking layer are removed at a pitch A in the first or second direction. At this time, the thickness d of the current blocking layer satisfies a relationship of 0.5×d/tan θ<A(n−1/2)<1.5×d/tan θ (n: a natural number). Then, the electrodes are formed on removal trace portions of the current diffusing layer that reflect the removed portions of the current blocking layer.

The removal trace portions in the current diffusing layer are formed while displaced by d/tan θ from the actually removed portions of the current blocking layer. In this embodiment, with the setting such that the displacement amount d/tan θ becomes around (a natural number n minus 1/2) times the above-mentioned pitch A, for example A/2, the removal trace portions are positioned directly above the current blocking portions, and the electrodes are formed on the respective removal trace portions. With this arrangement, even though no alignment pattern exists, merely by forming the front electrodes on the respective removal trace portions, a projected image of each front electrode on the corresponding current blocking portion can be prevented from jutting out of this current blocking portion. Therefore, this embodiment makes it possible to easily form the electrodes with high accuracy in positions just above the current blocking portions to thereby suppress the ineffective emitted light just below the electrodes. Also, it is possible to obviate the need of separately providing an alignment pattern, thereby allowing the yield to be improved.

Furthermore, according to this embodiment, in the current diffusing layer, mesa-shaped portions are formed in positions over the respective removed portions of the current blocking layer, or light emitting portions of the diode. Those mesa-shaped portions are defined between the adjacent removal trace portions reflecting the shape of the respective removed portions of the current blocking layer. As is obvious, in the present embodiment, the mesa-shaped portions are formed without etching the current diffusing layer, but by only etching the current blocking layer. Therefore, it is possible to reduce the emitted light that is totally reflected on the surface of the current diffusing layer, without complicating the fabricating process.

In one embodiment, the first direction is a direction of a vector perpendicular to a [1 0 0] vector after the former has been rotated, within a plane vertical to the semiconductor substrate, by the angle θ in a direction of rotation of the [1 0 0] vector toward a normal vector of the substrate such that the vector perpendicular to the [1 0 0] vector becomes parallel to the surface of the semiconductor substrate.

In each of the above embodiments, if the semiconductor substrate is a GaAs substrate, then materials that match with the GaAs substrate in terms of lattice can be easily used for the light emitting layer.

If the light emitting layer is constructed of one of more films of $Al_xGa_yIn_{1-x-y}P$ ($0 \leq x \leq 1$, $0 \leq y \leq 1$), high-efficiency light emitting diodes ranging from a red color to a green color are achieved.

If the semiconductor substrate is inclined in a [0 1 1] or [0 $\bar{1}$ $\bar{1}$] direction with respect to the (1 0 0) plane, then $Al_xGa_yIn_{1-x-y}P$ ($0 \leq x \leq 1$, $0 \leq y \leq 1$) light emitting diodes have a high emission efficiency.

If the $Al_xGa_yIn_{1-x-y}P$ ($0 \leq x \leq 1$, $0 \leq y \leq 1$) current diffusing layer of the second conductive type is provided by a GaP layer, a light emitting diode having a high moisture resistance and a low electric resistance can be achieved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

<First Embodiment>

Figure 1A:
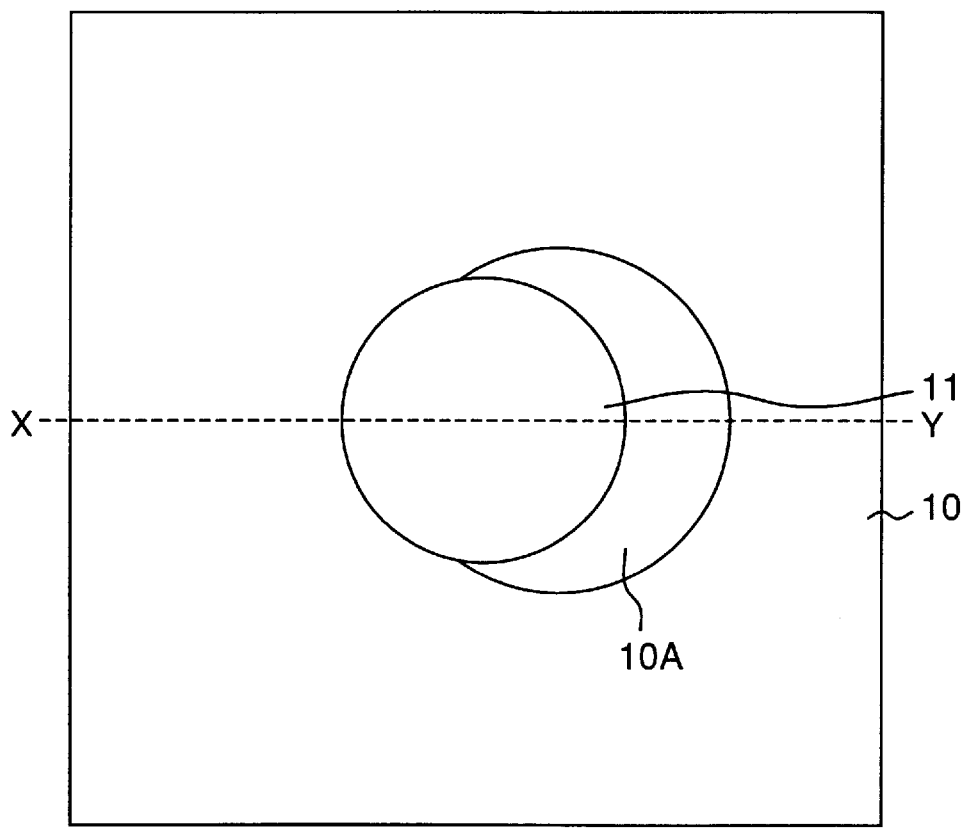
FIG. 1A is a surface view of a light emitting diode fabricated by the light emitting diode fabricating method according to a first embodiment of the present invention.
Figure 1B:
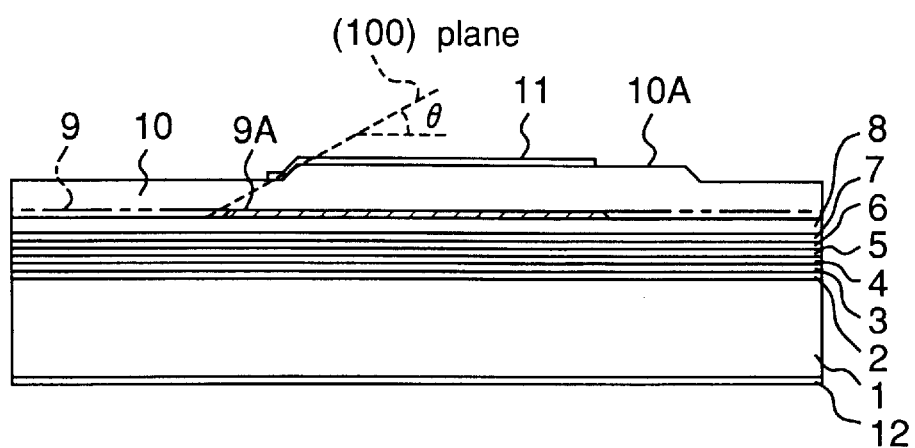
FIG. 1B is a sectional view taken along the line X-Y in FIG. 1A.

FIG. 1A is a view showing a front, or top surface of an AlGaInP light emitting diode fabricated by a light emitting diode fabricating method according to a first embodiment of the present invention. FIG. 1B is a sectional view taken along the line X-Y in FIG. 1A.

Figure 2A:
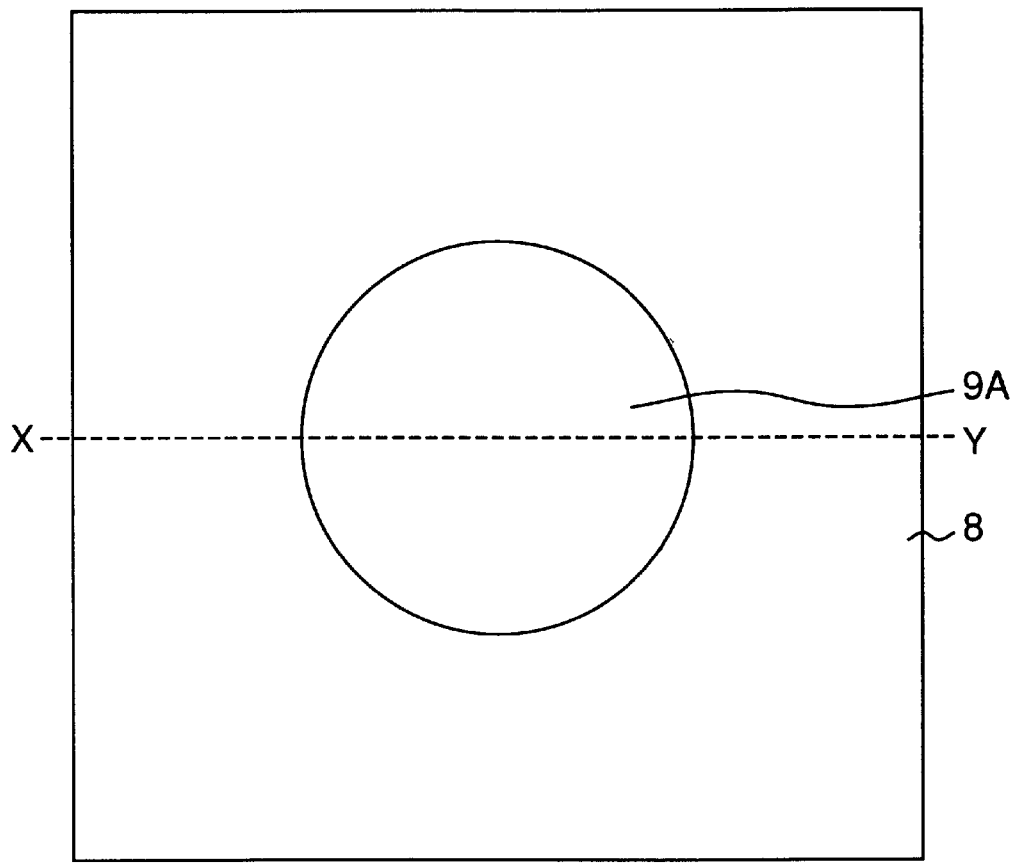
FIG. 2A is a surface view of the light emitting diode during the first half of the fabricating process of the first embodiment.
Figure 2B:
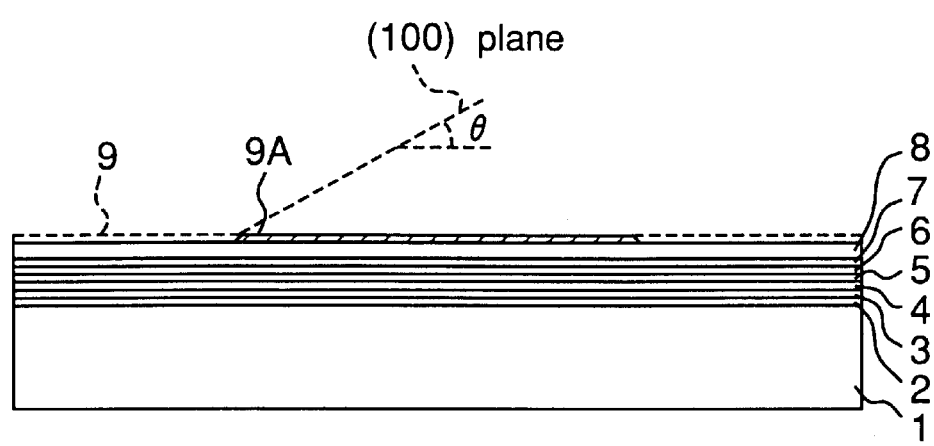
FIG. 2B is a sectional view taken along the line X-Y in FIG. 2A.

The light emitting diode fabricating process of the first embodiment will be described with reference to FIGS. 2A–6B. As shown in FIG. 2B which shows a part of a wafer, an n-type GaAs buffer layer 2 is formed to a thickness of 1 $\mu$m on an n-type GaAs substrate 1 by the MOCVD (Metal Organic Chemical Vapor Deposition) method. The top surface of the substrate is inclined at an angle of 15° ($\theta$=15°) with respect to the (1 0 0) plane in the [0 1 1] direction. Next, a DBR (Distributed Bragg Reflector) layer 3 consisting of ten pairs of an n-type $Al_{0.5}In_{0.5}P$ film and an n-type $(Al_{0.4}Ga_{0.6})_{0.5}In_{0.5}P$ film, an n-type $Al_{0.5}In_{0.5}P$ first cladding layer 4 of a thickness of 1 $\mu$m, a p-type $(Al_{0.3}Ga_{0.7})_{0.5}In_{0.5}P$ active layer 5 of a thickness of 0.5 $\mu$m, a p-type $Al_{0.5}In_{0.5}P$ second cladding layer 6 of a thickness of 1 $\mu$m, a p-type AlGaInP intermediate layer 7 of a thickness of 0.15 $\mu$m, a p-type GaP first current diffusing layer 8 of a thickness of 1 $\mu$m and an n-type GaP current blocking layer 9 of a thickness of 0.3 $\mu$m are successively formed by the MOCVD method.

The first cladding layer 4, the active layer 5, and the second cladding layer 6 constitute a light emitting layer as recited in claim 1. Depending upon desired characteristics of the device, it is possible to form the light emitting layer directly on the substrate 1 without forming the layers 2 and 3. Furthermore, it is also possible to omit the intermediate layer 7 and the first current diffusing layer 8 and form the current blocking layer 9 directly on the light emitting layer.

Figure 3:
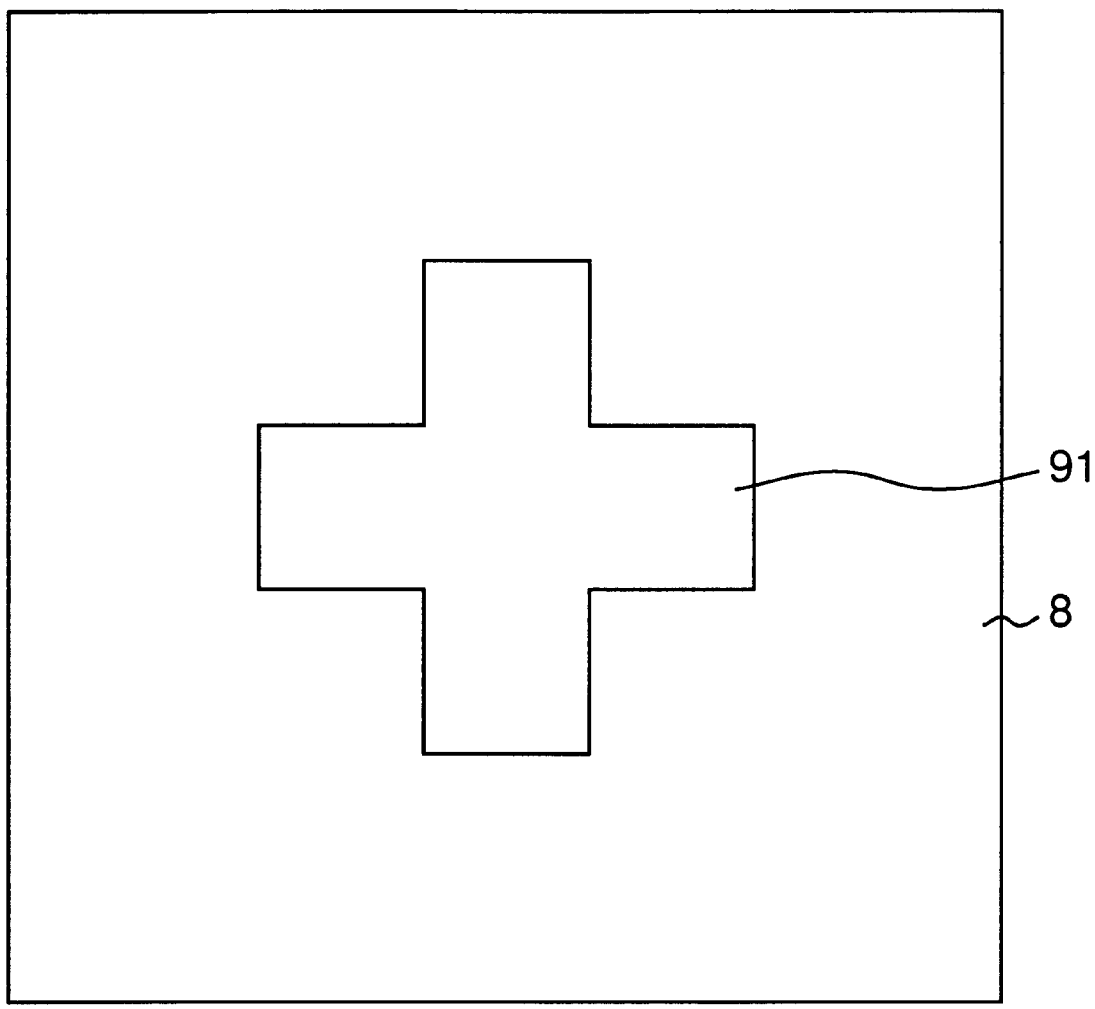
FIG. 3 shows a first alignment pattern to be used for the first embodiment.

Subsequently, the n-type GaP current blocking layer 9 is removed, except for a circular current blocking portion 9A having a diameter of 140 $\mu$m, by being etched to the p-type GaP first current diffusing layer 8 by photolithography and using a sulfuric acid/hydrogen peroxide etchant. It is to be noted that in addition to the current blocking portion 9A, a cross-shaped first alignment portion 91 as shown in FIG. 3 is left in a different position on the wafer in this etching stage.

Figure 6A:
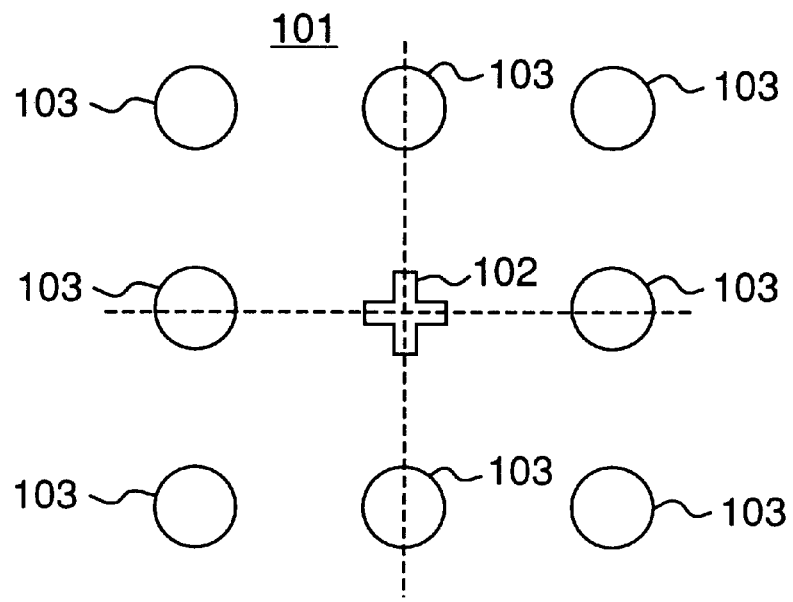
FIG. 6A is a plan view of a current blocking layer removal pattern used in the first embodiment.

FIG. 6A shows a removal pattern 101 for etching the current blocking layer 9. This removal pattern 101 has a cross-shaped first alignment pattern 102 and circle patterns 103 that are arranged so as to surround the first alignment pattern 102. One of the circle patterns 103 corresponds to the shown current blocking portion 9A, while the cross-shaped pattern 102 corresponds to the first alignment portion 91.

Figure 4A:
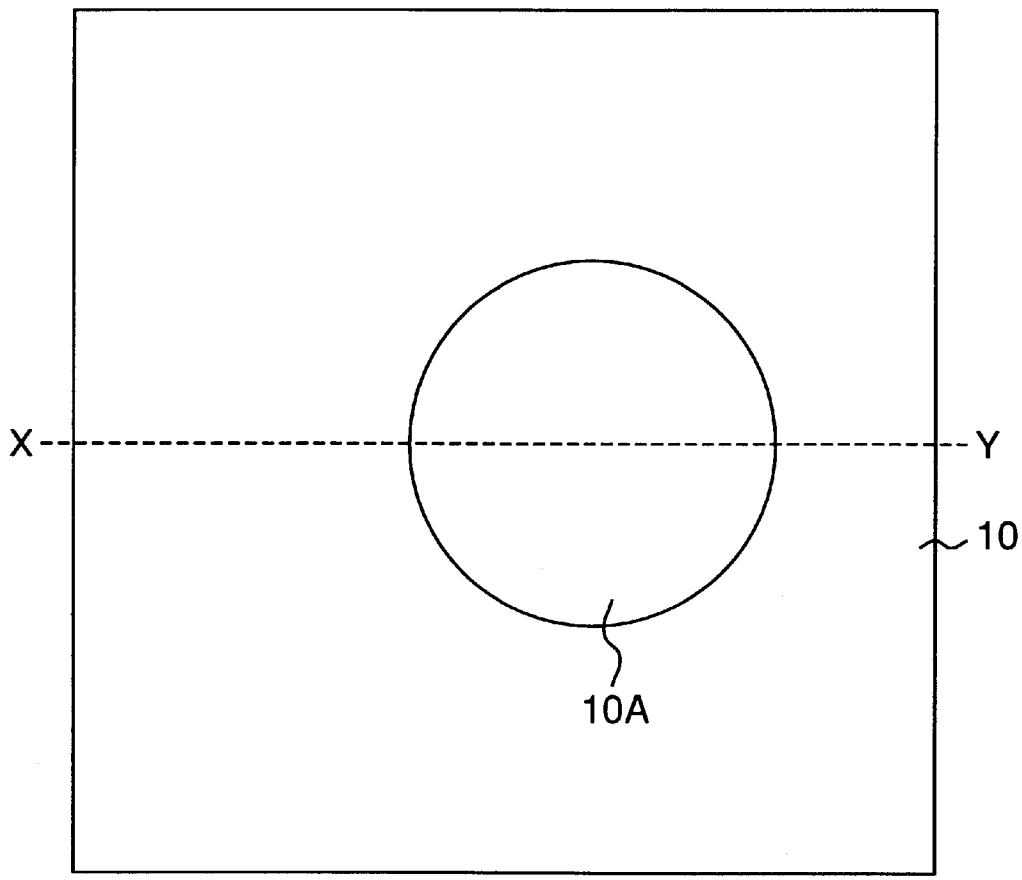
FIG. 4A is a surface view of the light emitting diode during the second half of the fabricating process of the first embodiment.
Figure 4B:
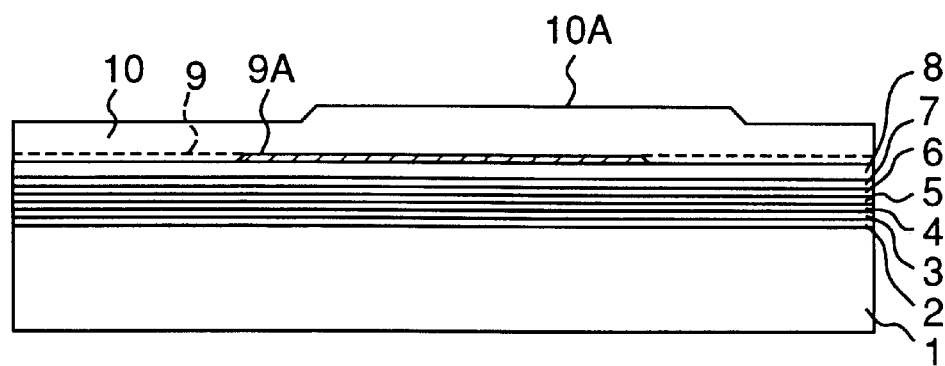
FIG. 4B is a sectional view taken along the line X-Y in FIG. 4A.

Next, as shown in FIGS. 4A and 4B, a p-type GaP second current diffusing layer 10 of 7 $\mu$m in thickness is formed on the remaining n-type GaP current blocking layer 9 and the exposed p-type GaP first current diffusing layer 8. The diffusing layer 10 has a surface shaped portion 10A that protrudes reflecting the shape of the current blocking portion 9A. Also, the diffusing layer 10 has another surface shaped portion (not shown) that protrudes reflecting the shape of the first alignment portion 91.

Figure 5A:
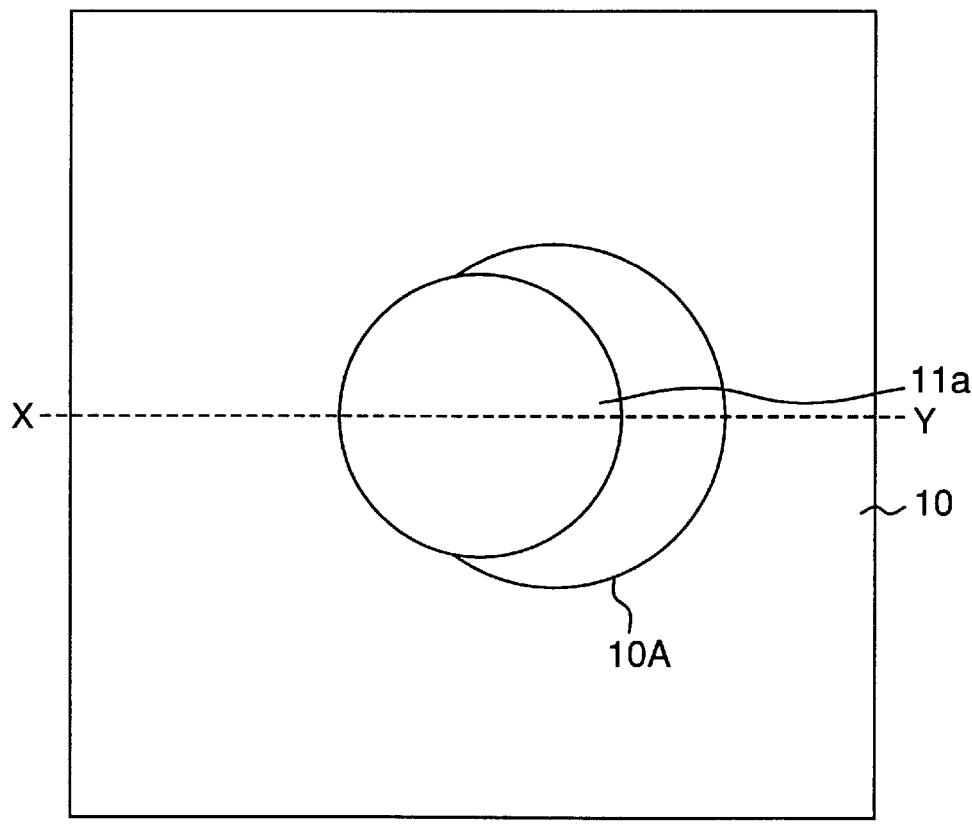
FIG. 5A is a surface view of the light emitting diode in the final stage of the fabricating process of the first embodiment.
Figure 5B:
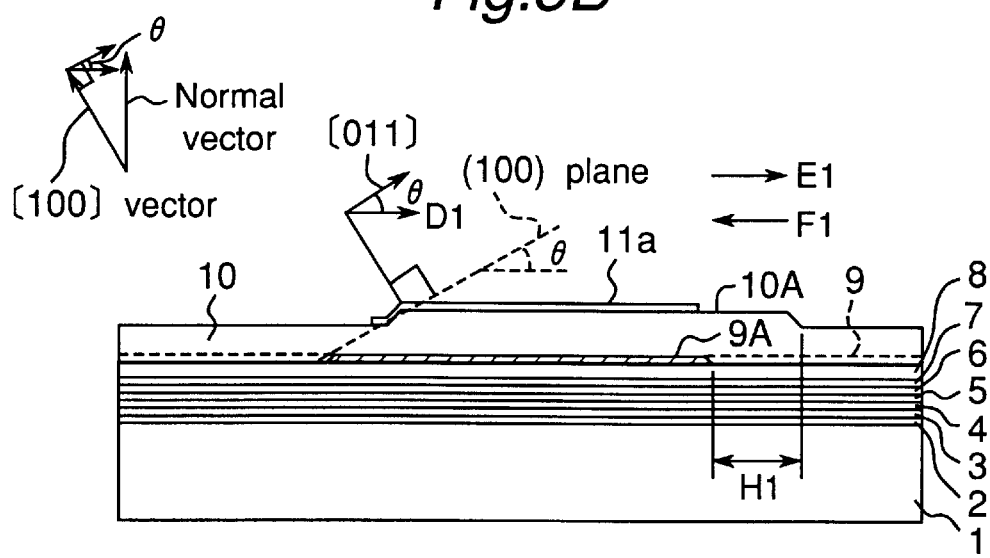
FIG. 5B is a sectional view taken along the line X-Y in FIG. 5A.

Subsequently, as shown in FIGS. 5A and 5B, AuBe/Au is deposited on the p-type GaP second current diffusing layer 10. Then, the AuBe/Au film is subjected to etching by photolithography with an Au etchant to form a front electrode 11a having a diameter of 110 μm.

Figure 6B:
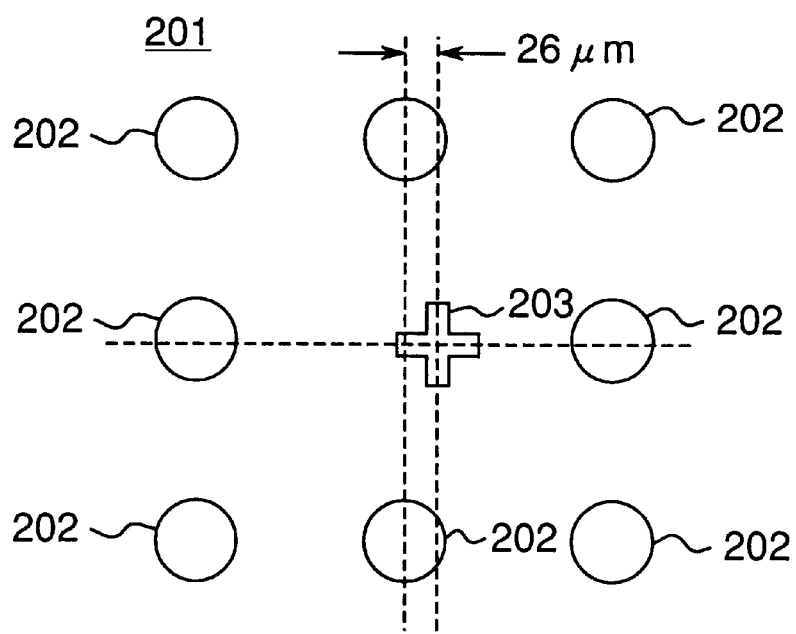
FIG. 6B is a plan view of a front electrode forming pattern used in the first embodiment.

FIG. 6B shows an electrode forming photomask pattern 201 to be used in this etching stage. This photomask pattern 201 has circular electrode patterns 202 positioned in correspondence to the eight circle patterns 103 of the removal pattern 101 shown in FIG. 6A, and a second alignment pattern 203. This second alignment pattern 203 has a cross-like shape similar to that of the first alignment pattern 102, but is displaced or shifted by 26 μm (≈7 μm/tan 15°) from the position of the first alignment pattern 102 for the circle patterns 103. The direction in which the second alignment pattern 203 is displaced is set to a direction (D1 in FIG. 5B) that is rotated at an angle θ=15° with respect to the [0 1 1] direction so as to be parallel to the GaAs substrate 1. The direction [0 1 1] is a direction of a vector perpendicular to a [1 0 0] vector which is inclined with respect to a normal vector of the substrate.

Then, with this second alignment pattern 203 aligned with the surface shaped portion (not shown), of the diffusing layer 10, that reflects the shape of the first alignment portion 91, the aforementioned etching is performed, whereby the front electrode 11a is formed directly above the current blocking portion 9A.

Subsequently, heat treatment is performed, and the front electrode 11a results in a p-type ohmic contact electrode 11. Then, the back of the GaAs substrate 1 is abraded to a depth of about 280 μm, and deposited with an AuGe/Au film. Then heat treatment is performed, so that an n-type ohmic contact electrode 12 is formed.

According to the fabricating process of this embodiment, as shown in FIG. 5B, the front electrode 11 (11a) is formed in a position displaced from the surface shaped portion 10A of the current diffusing layer 10 in a direction F1 opposite to a direction E1 in which the surface shaped portion 10A reflecting the shape of the current blocking portion 9A is displaced from the current blocking portion 9A. The displacement in the opposite direction F1 is approximately equal to the displacement H1 of the surface shaped portion 10A in the direction E1.

Therefore, according to this embodiment, the front electrode 11 can be formed directly above the current blocking portion 9A with high accuracy. Therefore, the current blocking portion 9A can surely fulfill its function to suppress the ineffective emitted light under the front electrode 11.

Ten lots of light-emitting diodes fabricated by the fabricating method of this embodiment were subjected to a sampling inspection, and the result showed an improvement in the average value of luminance of a total of 100 chips (10 chips per lot) to 90 mcd in contrast to the luminance of 80 mcd of those made by the prior art fabricating method.

<Second Embodiment>

Figure 7A:
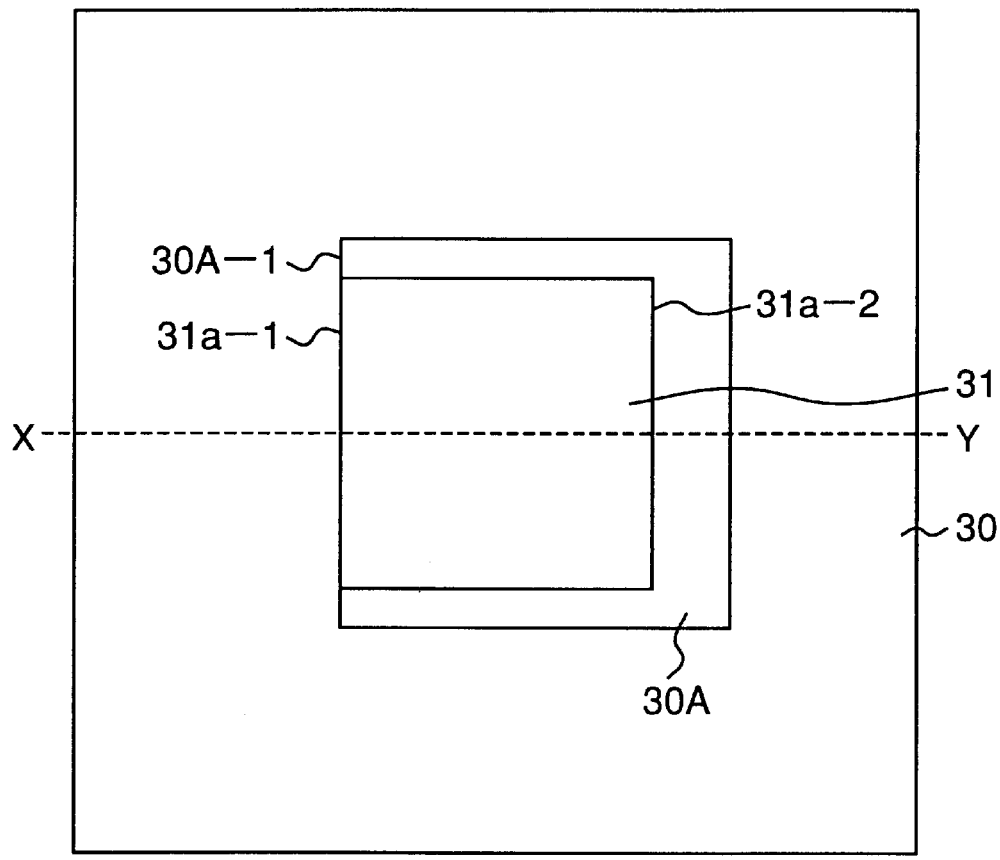
FIG. 7A is a surface view of a light emitting diode fabricated by the light emitting diode fabricating method according to a second embodiment of the present invention.
Figure 7B:
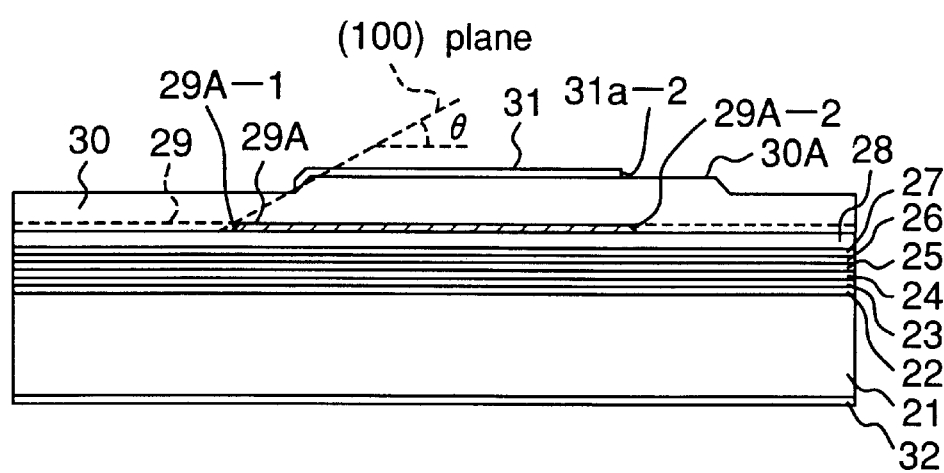
FIG. 7B is a sectional view taken along the line X-Y in FIG. 7A.

FIG. 7A is a view showing a top surface of an AlGaInP light emitting diode fabricated by a light emitting diode fabricating method according to a second embodiment of the present invention. FIG. 7B is a sectional view taken along the line X-Y in FIG. 7A.

Figure 8A:
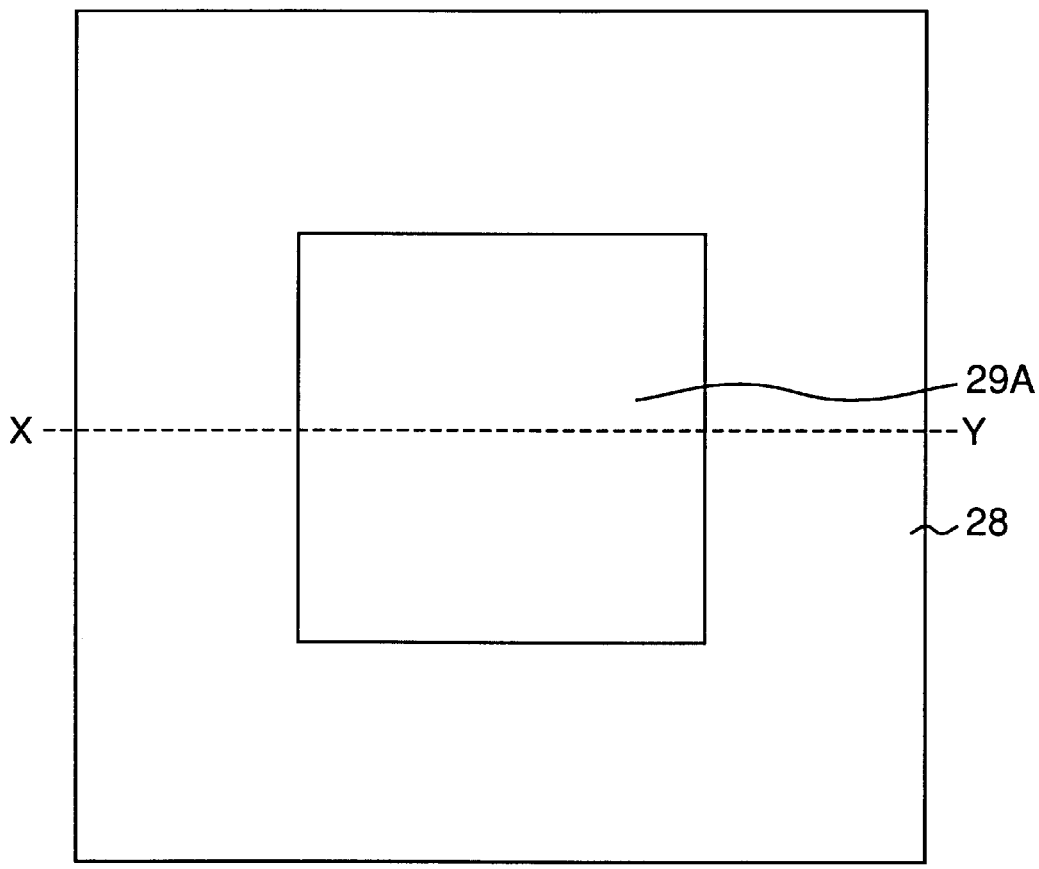
FIG. 8A is a surface view of the light emitting diode during the first half of the fabricating process of the second embodiment.
Figure 8B:
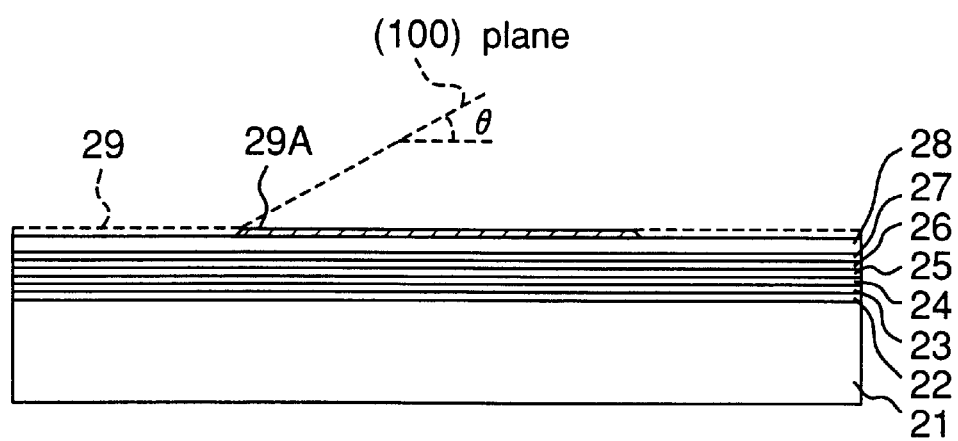
FIG. 8B is a sectional view taken along the line X-Y in FIG. 8A.

The light emitting diode fabricating process of the second embodiment will be described with reference to FIGS. 8A–10B which show a part of a wafer. As shown in FIG. 8B, an n-type GaAs buffer layer 22 is formed to a thickness of 1 μm on an n-type GaAs substrate 21 by the MOCVD method. The substrate 21 is inclined at an angle of θ=15° with respect to the (1 0 0) plane in the [0 1 1] direction. Next, a DBR layer 23 consisting of ten pairs of an n-type $Al_{0.5}In_{0.5}P$ film and an n-type $(Al_{0.4}Ga_{0.6})_{0.5}In_{0.5}P$ film, an n-type $Al_{0.5}In_{0.5}P$ first cladding layer 24 of a thickness of 1 μm, a p-type $(Al_{0.3}Ga_{0.7})_{0.5}In_{0.5}P$ active layer 25 of a thickness of 0.5 μm, a p-type $Al_{0.5}In_{0.5}P$ second cladding layer 26 of a thickness of 1 μm, a p-type AlGaInP intermediate layer 27 of a thickness of 0.15 μm, a p-type GaP first current diffusing layer 28 of a thickness of 1 μm and an n-type GaP current blocking layer 29 of a thickness of 0.3 μm are successively formed by the MOCVD method. The first cladding layer 24, the active layer 25 and the second cladding layer 26 form a light emitting layer. Subsequently, the n-type GaP current blocking layer 29 is removed, except for a 140 μm×140 μm square portion 29A, as clearly shown in FIG. 8A, by being etched to the p-type GaP first current diffusing layer 28 by photolithography and using a sulfuric acid/hydrogen peroxide etchant.

Note that modifications as described above with respect to the first embodiment are also applicable to the second embodiment.

Figure 9A:
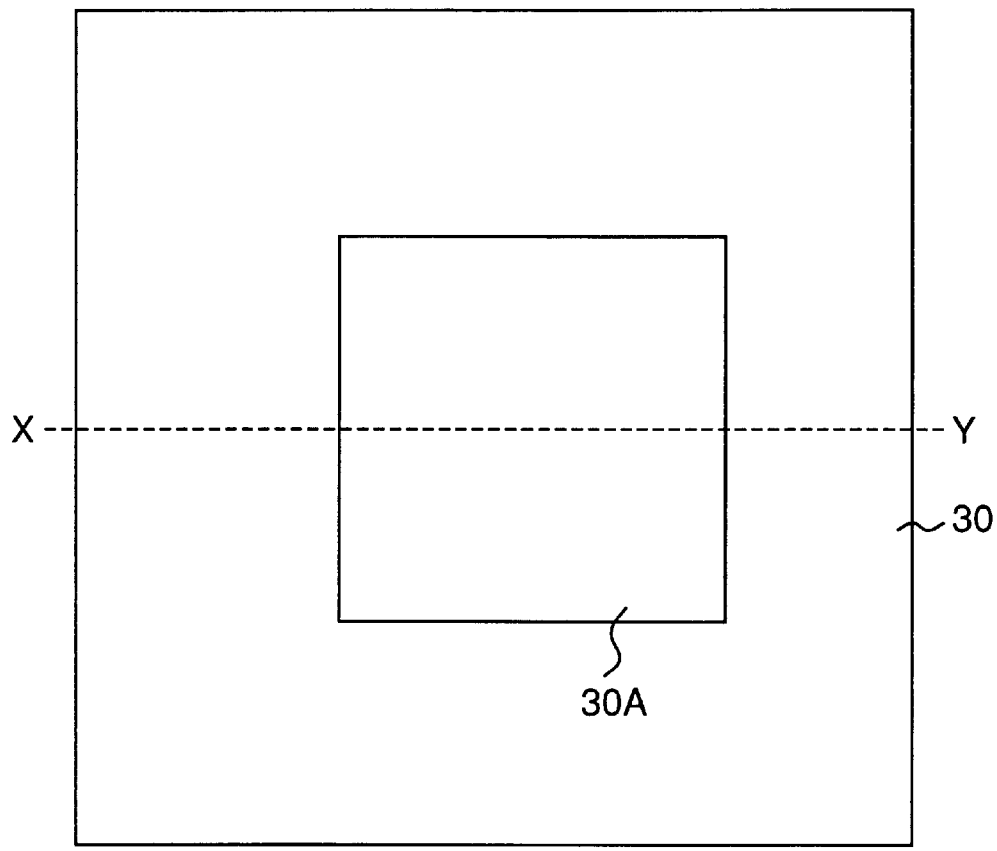
FIG. 9A is a surface view of the light emitting diode during the second half of the fabricating process of the second embodiment.
Figure 9B:
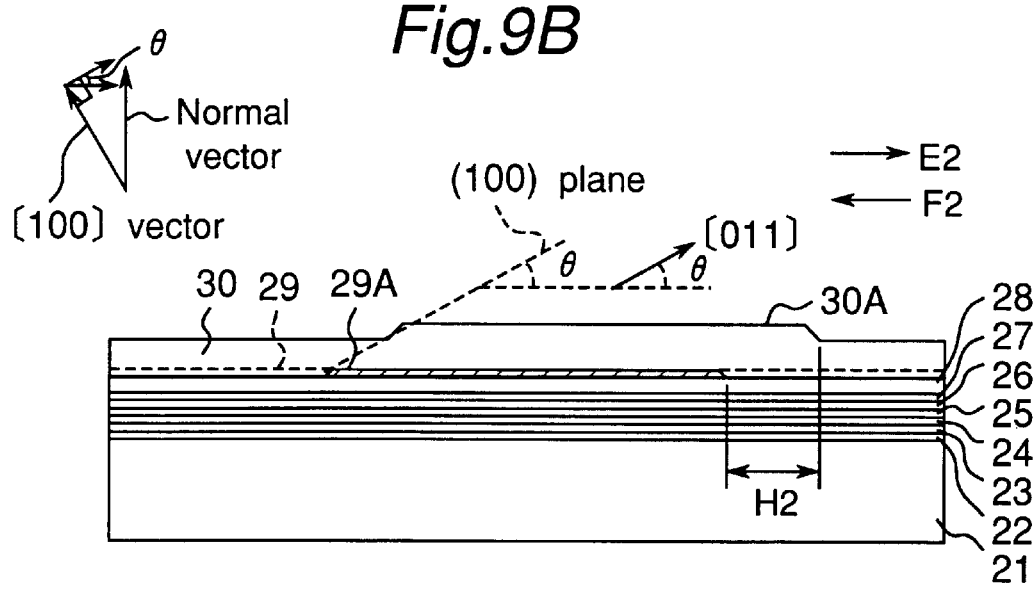
FIG. 9B is a sectional view taken along the line X-Y in FIG. 9A.

Next, as shown in FIGS. 9A and 9B, a p-type GaP second current diffusing layer 30 of 4 μm in thickness is formed on the n-type GaP current blocking portion 29A and the exposed p-type GaP first current diffusing layer 28. The diffusing layer 30 has a surface shaped portion 30A reflecting the shape of the current blocking portion 29A. This surface shaped portion 30A is displaced by a dimension H2 in a direction E2 from the current blocking portion 29A due to the fact that the GaAs substrate 21 is inclined at an angle θ=15° with respect to the (1 0 0) plane. Because the thickness d of the second current diffusing layer 30 is 4 μm, the dimension H2 is 14.9 μm (≈4 μm÷tan 15°).

Figure 10A:
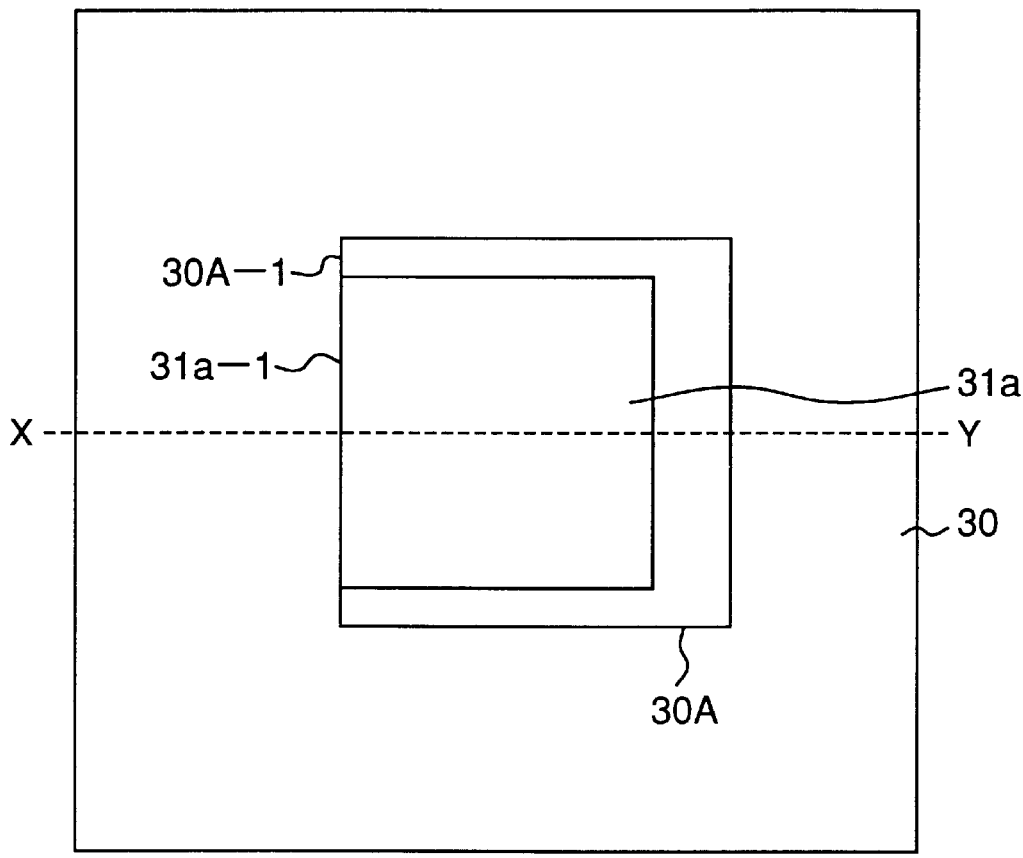
FIG. 10A is a surface view of the light emitting diode in the final stage of the fabricating process of the second embodiment.
Figure 10B:
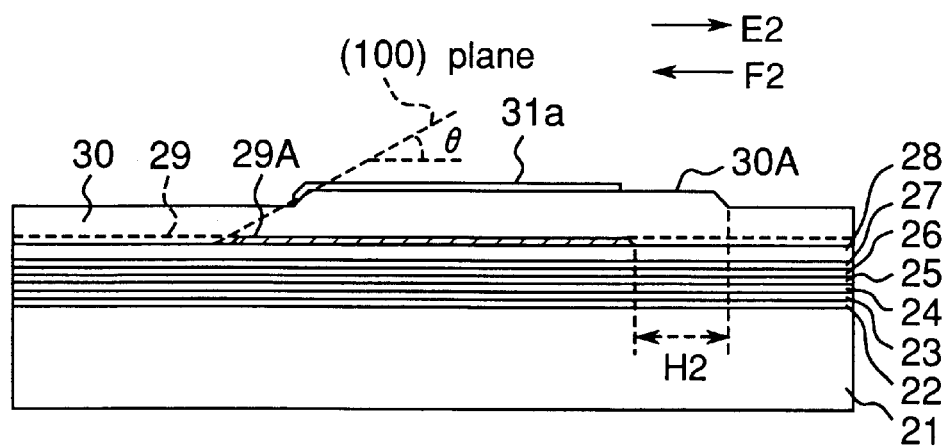
FIG. 10B is a sectional view taken along the line X-Y in FIG. 10A.

Subsequently, as shown in FIGS. 10A and 10B, AuBe/Au is deposited on the p-type GaP second current diffusing layer 30. Then, the AuBe/Au film is subjected to etching by photolithography using an Au etchant to form a 110 μm×110 μm square front electrode 31a. The front electrode 31a is formed in such a manner that a midpoint of one side 31a-1 in a direction F2 of the front electrode 31 substantially coincides with a midpoint of the corresponding side 30A-1 of the surface shaped portion 30A, as shown in FIG. 10A. The direction F2 is an opposite direction to a direction E2 in which the surface shaped portion 30A has been displaced from the current blocking portion 29A.

In other words, a photomask (not shown) for forming the electrode is aligned with the surface shaped portion 30A by superposing a side in the direction F2 of a electrode-forming square pattern upon the corresponding side 30A-1 with midpoints of both sides coinciding with each other. The direction F2 is a direction opposite to the direction obtained by rotating the [0 1 1] direction viewed from the center of the current blocking portion 29A by 15° within a plane perpendicular to the substrate so as to be parallel to the substrate (see FIG. 9B).

Subsequently, heat treatment is performed, and the front electrode 31a results in a p-type ohmic contact electrode 31 as shown in FIG. 7B. Then, the back of the GaAs substrate 21 is abraded to a depth of about 280 μm, and deposited with an AuGe/Au film. Then heat treatment is performed, so that an n-type ohmic contact electrode 32 is achieved.

According to this second embodiment, a length (=140 μm) of one side of the current blocking portion 29A was elongated by L=30 μm than a length (=110 μm) of one side of the front electrode 31a. This dimension L (=30 μm) is approximately two times as great as the displacement dimension H2 (=14.9 μm) of the surface shaped portion 30A.

Therefore, by aligning the one side 31a-1 of the front electrode 31a with the side 30A-1 located at the end in the direction F2 of the surface shaped portion 30A, the opposite sides 31a-1 and 31a-2 of the front electrode 31a are allowed to be positioned inside the corresponding opposite sides 29A-1 and 29A-2 of the current blocking portion 29A (see FIGS. 7A and 7B).

As obvious, according to this embodiment, the one side 30A-1 itself of the surface shaped portion 30A serves as an alignment pattern. Therefore, the front electrode 31a can be placed directly above the current blocking portion 29A even in the absence of an alignment pattern. Therefore, the current blocking portion 29A can surely fulfill its function to suppress the ineffective emitted light under the front electrode 31a, namely the p-type ohmic contact electrode 31.

Furthermore, because the alignment pattern is unnecessary, the yield is improved. Concretely, an area that is one hundredth of the chip is used for the alignment pattern according to the fabricating method of the first embodiment. However, since this alignment pattern is not necessitated in the second embodiment, the yield is improved by one percent.

<Third Embodiment>

Figure 11A:
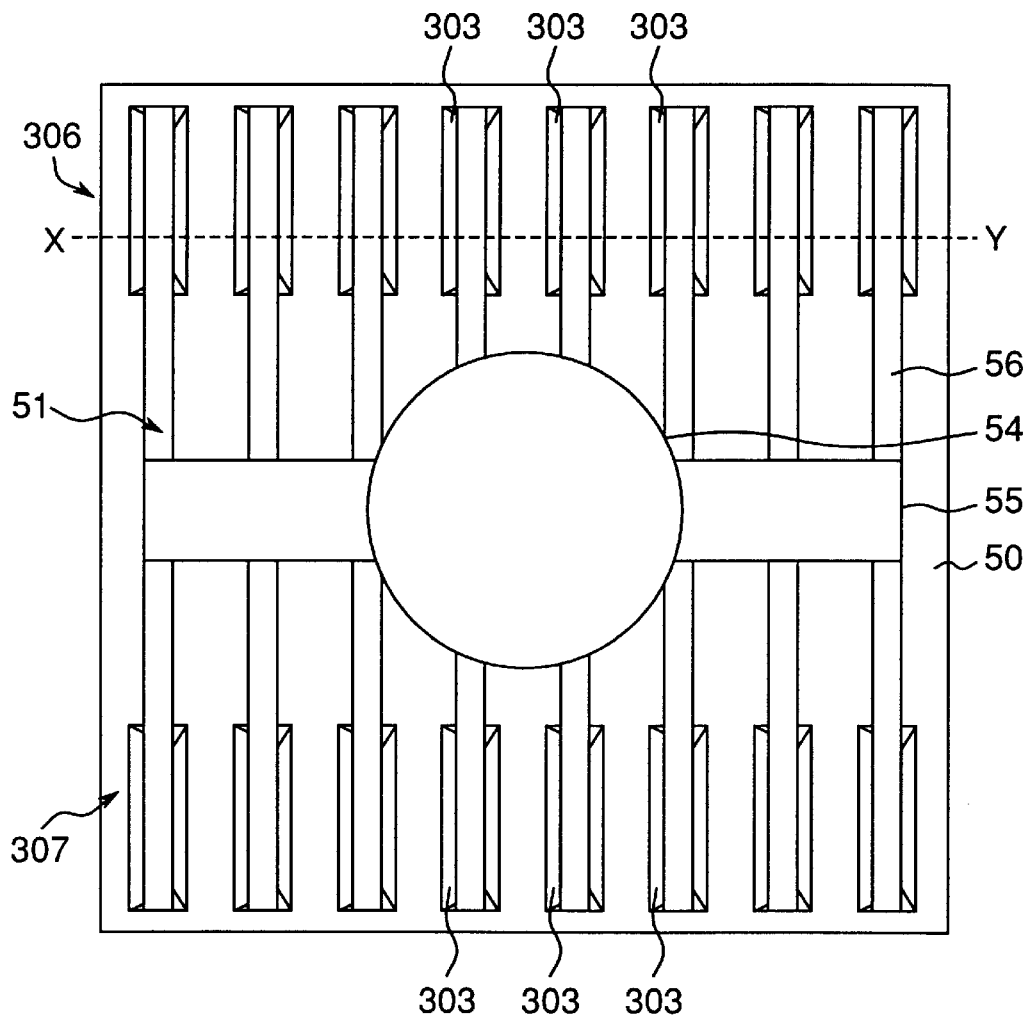
FIG. 11A is a surface view of a light emitting diode fabricated by the light emitting diode fabricating method according to a third embodiment of the present invention.
Figure 11B:
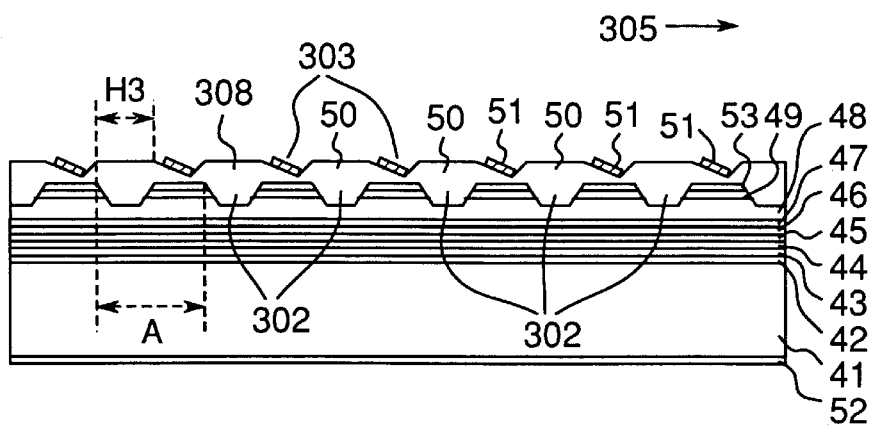
FIG. 11B is a sectional view taken along the line X-Y in FIG. 11A.

FIG. 11A is a view showing a top surface of an AlGaInP light emitting diode fabricated by a light emitting diode fabricating method according to a third embodiment of the present invention. FIG. 11B is a sectional view taken along the line X-Y in FIG. 11A.

The light emitting diode fabricating process of the third embodiment will be described with reference to FIGS. 12A–14B. As shown in FIG. 12B, an n-type GaAs buffer layer 42 is formed to a thickness of 1 μm on an n-type GaAs substrate 41 by the MOCVD method. The substrate 41 is inclined at an angle of 15° with respect to the (1 0 0) plane in the [0 1 1] direction. Next, a DBR layer 43 consisting of ten pairs of an n-type $Al_{0.5}In_{0.5}P$ film and an n-type $(Al_{0.4}Ga_{0.6})_{0.5}In_{0.5}P$ film, an n-type $Al_{0.5}In_{0.5}P$ first cladding layer 44 of a thickness of 1 μm, a p-type $(Al_{0.3}Ga_{0.7})_{0.5}In_{0.5}P$ active layer 45 of a thickness of 0.5 μm, a p-type $Al_{0.5}In_{0.5}P$ second cladding layer 46 of a thickness of 1 μm, a p-type AlGaInP intermediate layer 47 of a thickness of 0.15 μm, a p-type GaP first current diffusing layer 48 of a thickness of 1 μm, an n-type GaP current blocking layer 49 of a thickness of 0.5 μm, and a p-type GaP second current diffusing layer 53 of a thickness of 4 μm are successively formed by the MOCVD method. The first cladding layer 44, the active layer 45, and the second cladding layer 46 form a light emitting layer.

Modifications as described above with respect to the first embodiment are also applicable to the third embodiment.

Subsequently, the p-type second current diffusing layer 53 and the n-type GaP current blocking layer 49 are etched to the p-type GaP first current diffusing layer 48 by photolithography and using a sulfuric acid/hydrogen peroxide etchant.

Figure 12A:
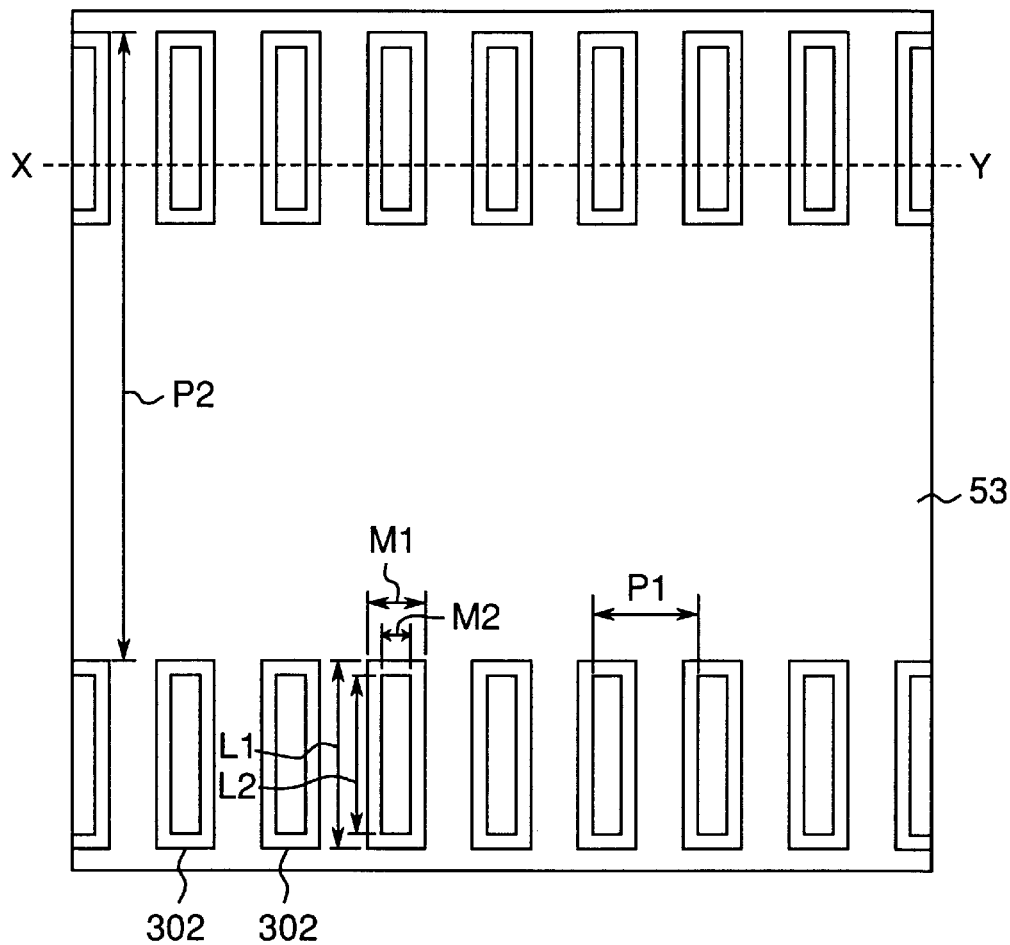
FIG. 12A is a surface view of the light emitting diode during the first half of the fabricating process of the third embodiment.
Figure 12B:
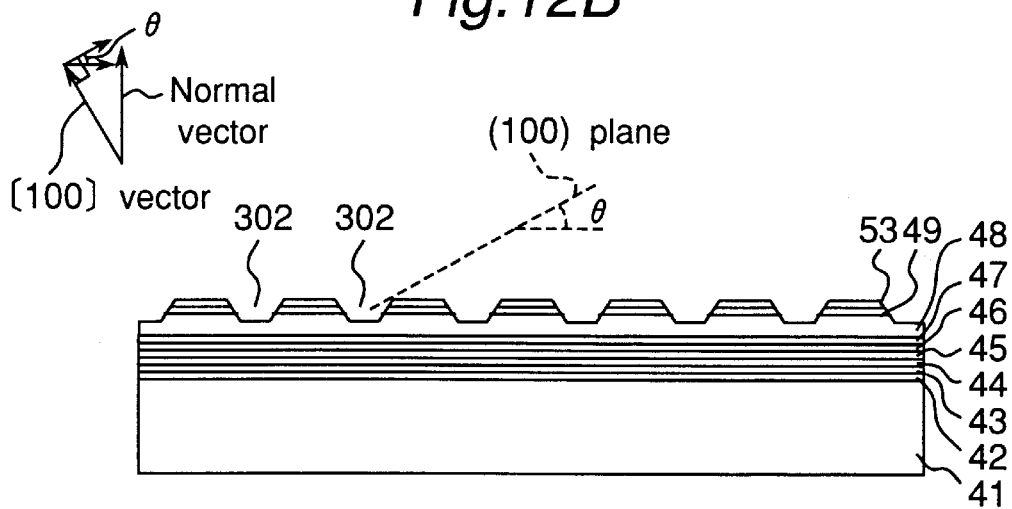
FIG. 12B is a sectional view taken along the line X-Y in FIG. 12A.

In this etching stage, etching patterns of an M2×L2 (10 μm×70 μm) rectangle are formed at a pitch P1=40 μm in the widthwise direction of the rectangle and at a pitch P2=250 μm in the lengthwise direction thereof, as obvious from FIG. 12A. The etching depth is set to about 5 μm. Therefore, the etching shape expands at the top surface of the second current diffusing layer 53 by 10 μm in each of the lengthwise and widthwise directions from the original rectangle to become an enlarged size of M1×L1 (20 μm×80 μm).

Figure 13A:
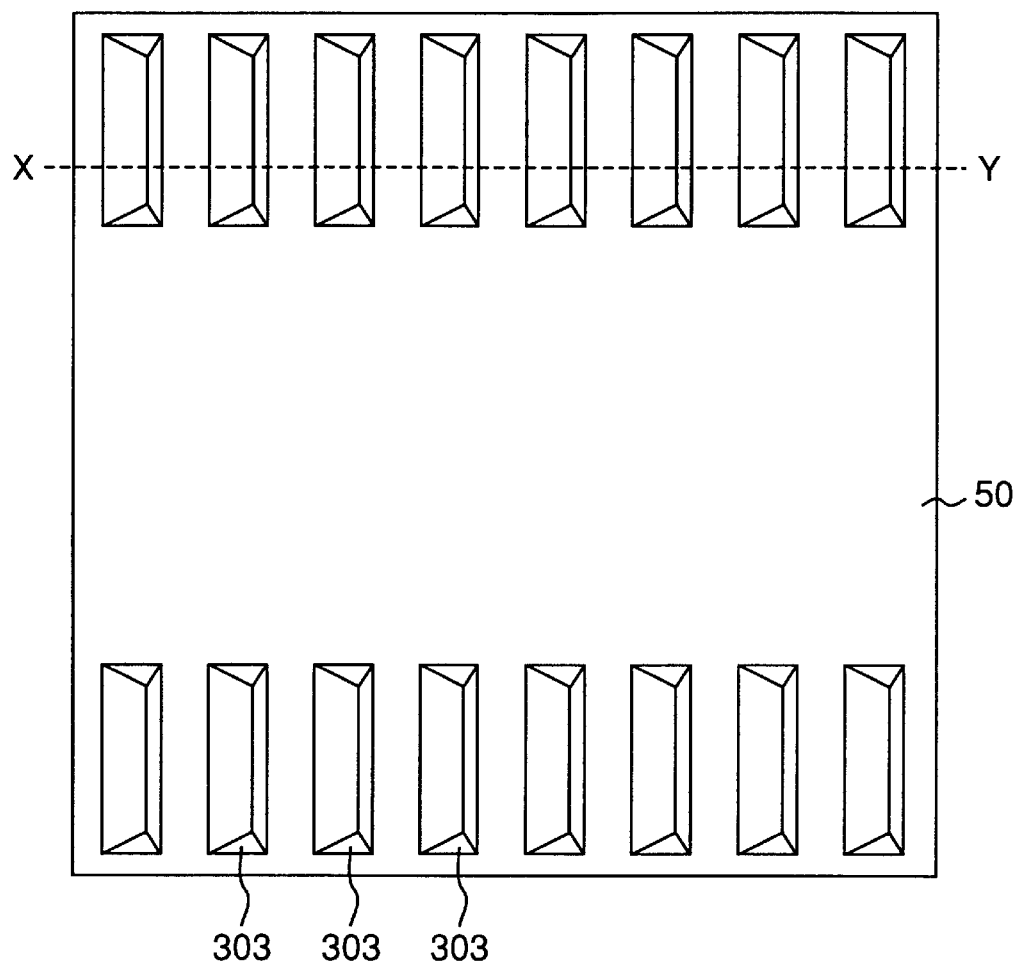
FIG. 13A is a surface view of the light emitting diode during the second half of the fabricating process of the third embodiment.
Figure 13B:
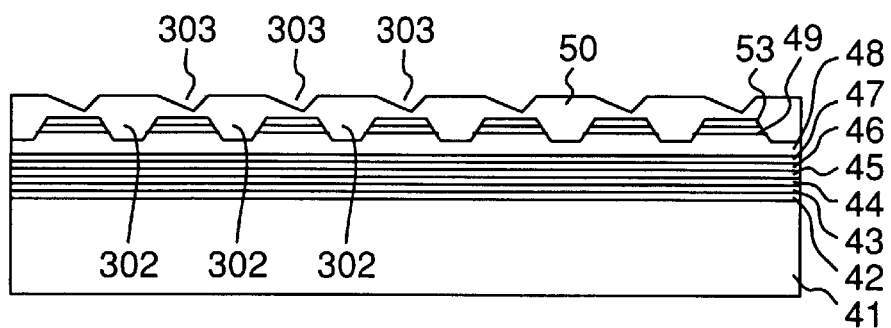
FIG. 13B is a sectional view taken along the line X-Y in FIG. 13A.
Figure 14A:
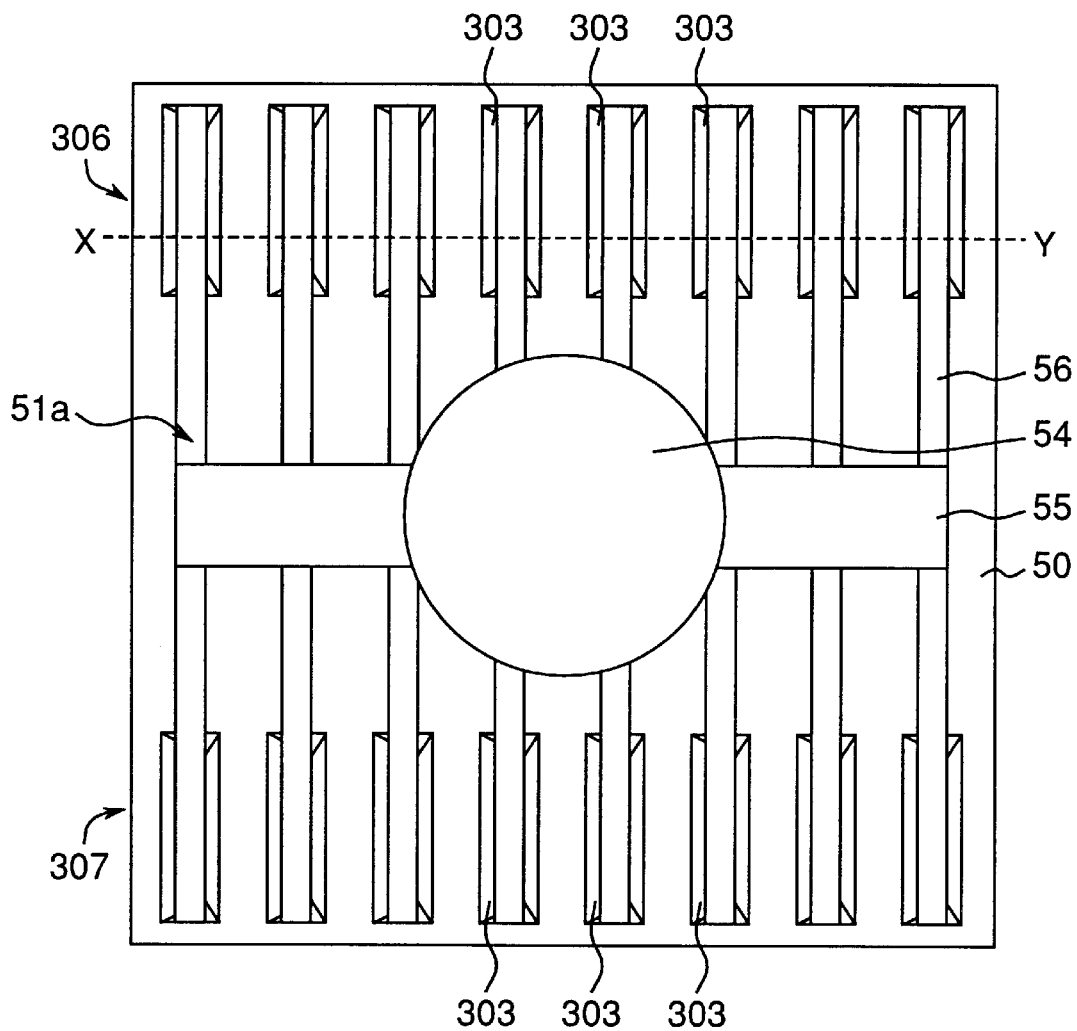
FIG. 14A is a surface view of the light emitting diode in the final stage of the fabricating process of the third embodiment.
Figure 14B:
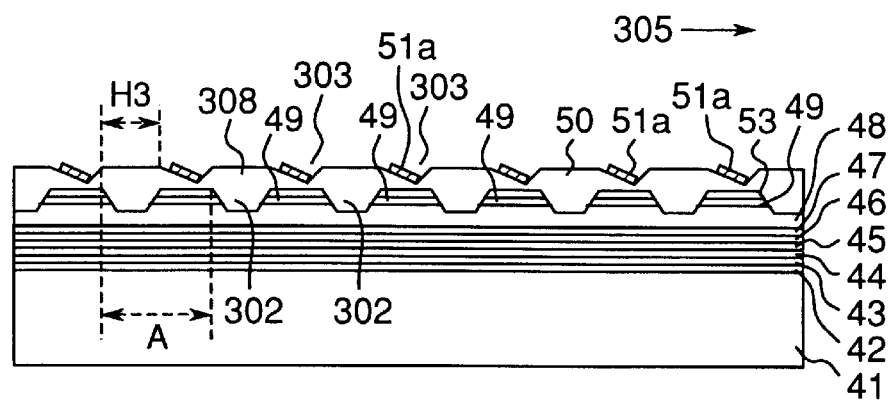
FIG. 14B is a sectional view taken along the line X-Y in FIG. 14A.
Figure 15:
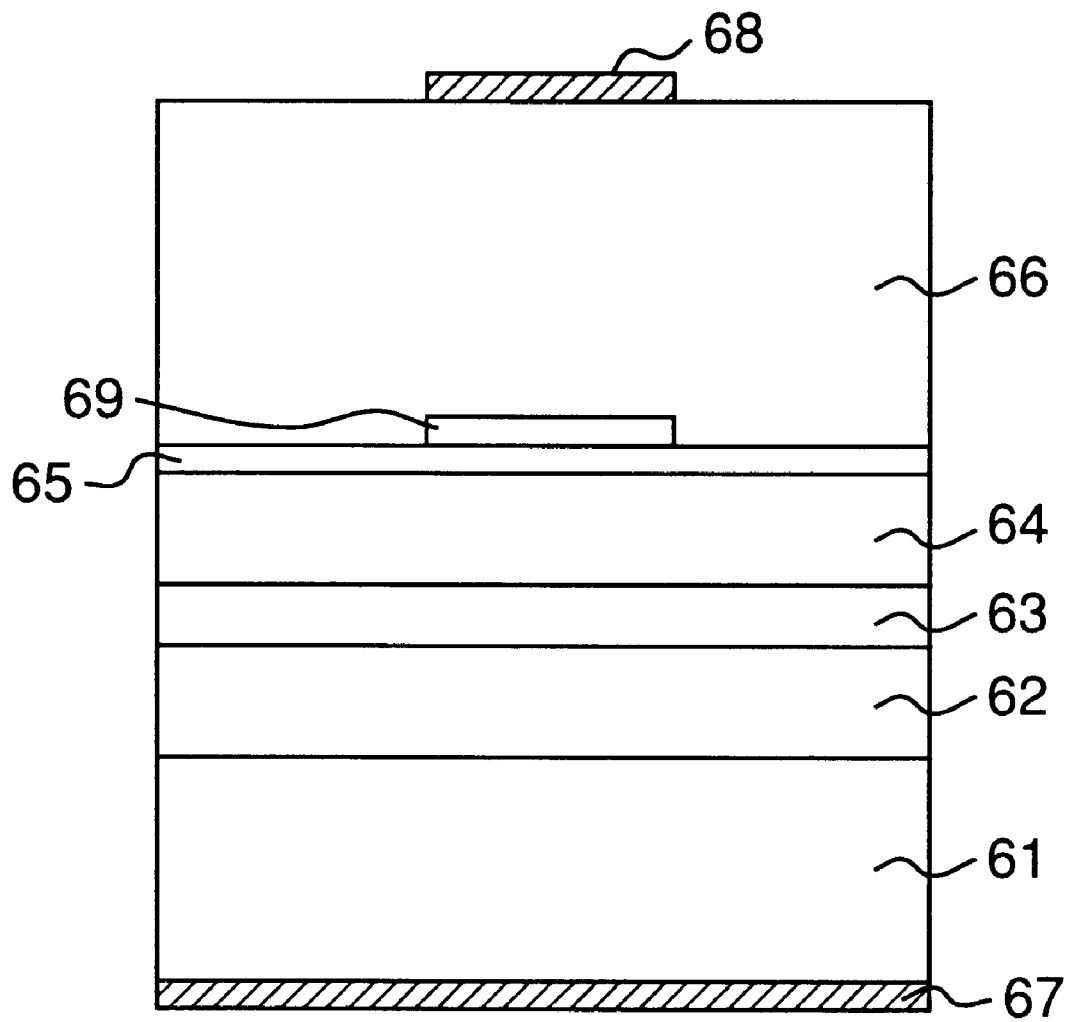
FIG. 15 is a sectional view of a prior art light emitting diode.

Next, as shown in FIG. 13B, a p-type GaP third current diffusing layer 50 of 5.5 μm in thickness is formed on the remaining n-type GaP current blocking layer 49, the exposed p-type GaP first and second current diffusing layers 48 and 53. Subsequently, as shown in FIG. 14B, AuBe/Au is deposited on the p-type GaP third current diffusing layer 50.

Then, the AuBe/Au film is subjected to etching by photolithography using an Au etchant to form a front electrode 51a.

A front electrode-forming mask pattern to be used in this etching stage is designed such that a bonding pad 54 having a diameter of 120 μm, first branch electrodes 55 having a width of 40 μm and second branch electrodes 56 having a width of 10 μm are formed. The bonding pad 54 and the first and second branch electrodes 55 and 56 constitute the front electrode 51a.

In this etching stage, alignment is performed so that each second branch electrode 56 is positioned on an associated channel trace 303 caused by a channel, or a removed portion 302 between the adjacent current blocking layers 49, and that the bonding pad 54 is positioned between an array 306 of the channel traces and an array 307 of the channel traces.

Subsequently, by performing heat treatment, the front electrode 51a results in a p-type ohmic contact electrode 51 as shown in FIGS. 11A and 11B. Then, the back of the GaAs substrate 41 is abraded to a depth of about 280 μm, and deposited with an AuGe/Au film. Then heat treatment is performed, so that an n-type ohmic contact electrode 52 is formed, as shown in FIG. 11B.

In the thus obtained light emitting diode, the current blocking layer 49 is formed with the channels 302 at a pitch of A=40 μm, and the third current diffusing layer 50 is formed to a thickness of 5.5 μm so as to fill the channels. In this case, a dimension of displacement H3 from the channel 302 of the channel trace 303 in a direction 305 in which the channel array extends is about 20 μm. This is because H3=5.5 μm÷tan 15°≈20 μm. Therefore, each channel trace 303 is positioned directly above the current blocking layer 49. In this case, alignment of the front electrode 51a can be done by aligning a center line of the second branch electrode 56 having a width of 10 μm with a center line of the corresponding channel trace 303 having a width of 20 μm. This consequently facilitates the alignment process for the formation of the front electrode 51a and allows the front electrode 51a to be securely formed on the current blocking layer 49 without preparing any special pattern for the alignment use. Consequently, the function of the current blocking layer 49 of suppressing the ineffective emitted light under the front electrode 51a is surely fulfilled.

Furthermore, because the third current diffusing layer 50 has a convex mesa-like shape in a position above the channel 302, emitted light that is totally reflected on the chip surface is reduced.

Therefore, as compared with the chip luminosity of about 90 mcd of the light emitting diode fabricated in accordance with the first embodiment, the chip luminosity of the light emitting diode fabricated in accordance with this third embodiment was improved to 110 mcd.

Figure 16:
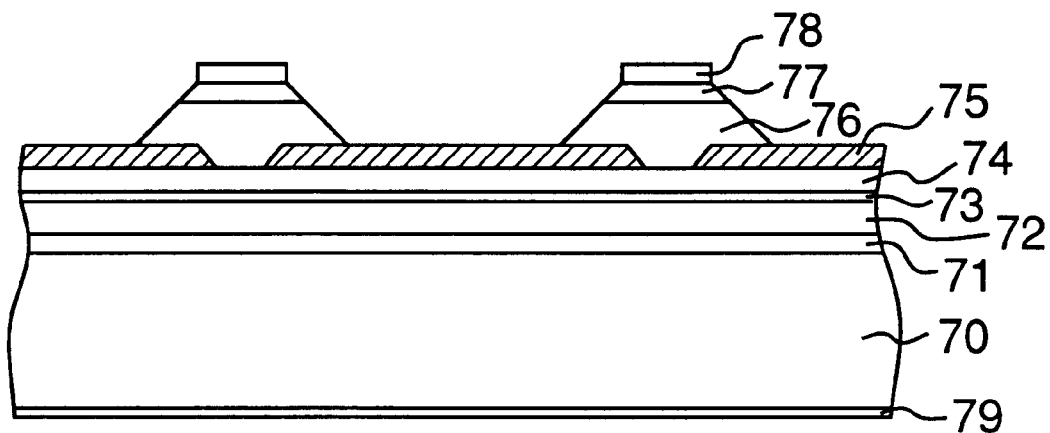
FIG. 16 is a sectional view of another prior art light emitting diode.
Figure 17:
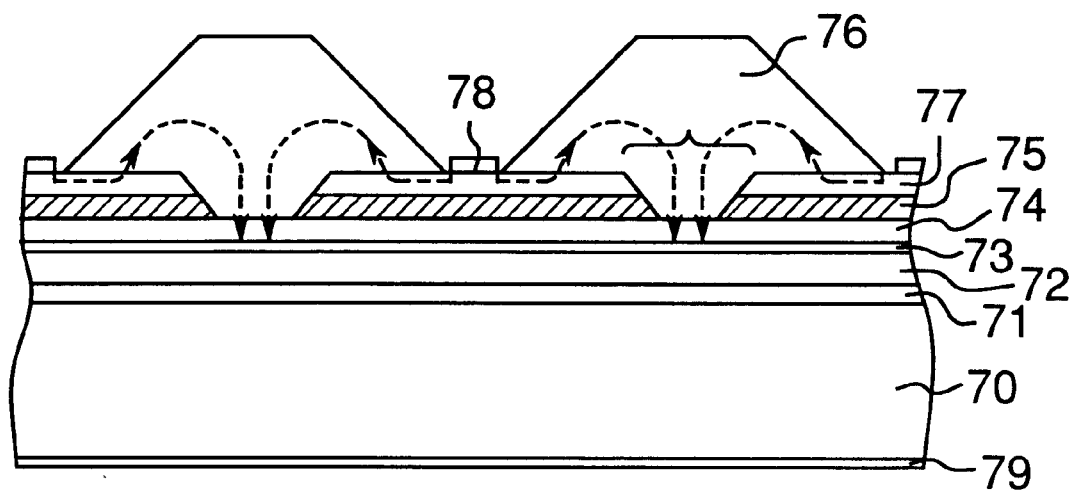
FIG. 17 is a sectional view of yet another prior art light emitting diode.

Furthermore, the light emitting diode fabricating method in accordance with this third embodiment provides the mesa-shaped portion 308 to the second current diffusing layer 50 by reflecting, or projecting on the third current diffusing layer 50 the channel shape formed through the etching of the second current diffusing layer 53, current blocking layer 49, and first current diffusing layer 48. Therefore, the fabricating process becomes simpler than that for the prior art light emitting diodes as shown in FIG. 16 and FIG. 17.

The first through third embodiments have been described on a case that the present invention is applied to formation of a light emitting diode wherein the semiconductor substrate is an n-type GaAs substrate whose crystal plane is inclined at an angle of 15° in the [0 1 1] direction from the (1 0 0) plane, the light emitting layer is constituted of an n-type $Al_{0.5}In_{0.5}P$ first cladding layer, a p-type $(Al_{0.3}Ga_{0.7})_{0.5}In_{0.5}P$ active layer, and a p-type $Al_{0.5}In_{0.5}P$ second cladding layer, and the current diffusing layer is formed of p-type GaP.

However, the light emitting diode fabricating method of the present invention can be applied to any light emitting diode as far as the semiconductor substrate has a top surface inclined at an angle θ from the (1 0 0) plane, a current blocking portion is formed between the light emitting layer and the current diffusing layer which is formed of $Al_xGa_yIn_{1-x-y}P$ ($0 \leq x \leq 1$, $0 \leq y \leq 1$) with a layer thickness d, and a front electrode is formed on the current diffusing layer. In any case, according to the present invention, the front electrode is formed over the current blocking portion while being displaced therefrom by 0.5×d/tan θ to 1.5×d/tan θ. The materials used in the aforementioned embodiments are not limitative, and it is a matter of course that a variety of materials can be selected.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode fabricating method comprising the steps of:

forming a light emitting layer over a top surface of a semiconductor substrate of a first conductivity type, the top surface being inclined at an angle θ (θ>0) with respect to a (1 0 0) plane of the semiconductor substrate, and then forming a current blocking layer of the first conductivity type over the light emitting layer;

partially removing the current blocking layer, wherein the current blocking layer that remains includes one or more current blocking portions;

forming an $Al_xGa_yIn_{1-x-y}P$ ($0 \leq x \leq 1$, $0 \leq y \leq 1$) current diffusing layer of a second conductivity type to a specified thickness 'd' over the remaining current blocking layer and the light emitting layer, wherein the current diffusing layer has one or more shaped portions reflecting a shape of the remaining current blocking layer and the one or more shaped portions are displaced in a first direction with respect to the remaining current blocking layer, the first direction being parallel to a surface of the remaining current blocking layer; and forming a respective electrode on a surface of each of the one or more shaped portions, each respective electrode being displaced relative to the corresponding shaped portion in a second direction opposite to the first direction by 0.5×(d/tan θ) to 1.5×(d/tan θ) in order to compensate for the displacement in the first direction of the corresponding shaped portion.

2. A light emitting diode fabricating method as claimed in claim 1, wherein the step of partially removing the current blocking layer uses a removal pattern having one or more current blocking portion patterns and a first alignment pattern to thereby leave the one or more current blocking portions and a first alignment portion on or above the light emitting layer, the step of forming a respective electrode on a surface of each of the one or more shaped portions uses an electrode forming pattern having one or more electrode patterns and a second alignment pattern, and forms a respective electrode on a surface of each of the one or more shaped portions by aligning the second alignment pattern with a shaped portion of the current diffusing layer that reflects a shape of the first alignment portion, wherein a position of the second alignment pattern relative to the one or more electrode patterns in the electrode forming pattern is displaced in the first direction by 0.5×(d/tan θ) to 1.5×(d/tan θ) from a position of the first alignment pattern relative to the one or more current blocking portion patterns in the removal pattern.

3. A light emitting diode fabricating method as claimed in claim 1, wherein the current blocking layer is removed such that each of the one or more current blocking portions has a dimension in the second direction larger than that of the corresponding electrode by 0.5×(d/tan θ) to 1.5×(d/tan θ), and each respective electrode is formed such that an end in the second direction of the electrode generally coincides with an end in the second direction of the corresponding shaped portion.

4. A light emitting diode fabricating method as claimed in claim 1, wherein:

in the step of removing the current blocking layer, a plurality of portions of the current blocking layer are removed at a pitch A in one or the other of the first and second directions;

the thickness d of the current blocking layer satisfies a relationship of 0.5×d/tan θ<A(n −1/2)<1.5×d/tan θ (n: a natural number); and the electrodes are formed on portions of the current diffusing layer that reflect the removed portions of the current blocking layer.

5. A light emitting diode fabricating method as claimed in claim 1, wherein the first direction is a direction that is parallel to the surface of the semiconductor substrate and that is rotated by the angle θ with respect to a [0 1 1] vector.

6. A light emitting diode fabricating method as claimed in claim 1, wherein said semiconductor substrate is a GaAs substrate.

7. A light emitting diode fabricating method as claimed in claim 1, wherein said light emitting layer consists of one or more films of $Al_xGa_yIn_{1-x-y}P$ ($0 \leq x \leq 1$, $0 \leq y \leq 1$).

8. A light emitting diode fabricating method as claimed in claim 1, wherein said semiconductor substrate is inclined in a [0 1 1] or [0 $\bar{1}$ $\bar{1}$] direction with respect to the (1 0 0) plane.

9. A light emitting diode fabricating method as claimed in claim 8, wherein an angle of inclination of the semiconductor substrate with respect to the (1 0 0) plane in the [0 1 1] or [0 $\bar{1}$ $\bar{1}$] direction is 5 degrees to 25 degrees.

10. A light emitting diode fabricating method as claimed in claim 1, wherein said current diffusing layer is formed of GaP.

11. A method of fabricating a light emitting diode, comprising the steps of:

forming a light emitting layer over a top surface of a semiconductor substrate of a first conductivity type, the top surface of said semiconductor substrate being inclined at an angle θ with respect to the (1 0 0) plane of said semiconductor substrate;

forming a current blocking layer of the first conductivity type over said light emitting layer;

patterning said current blocking layer using a first alignment pattern to provide a plurality of current blocking portions;

forming a current diffusing layer of a second conductivity type over said current blocking portions and said light emitting layer, wherein said current diffusing layer comprises shaped portions that each reflects a shape of a corresponding one of said current blocking portions; and forming a respective electrode on a surface of each shaped portion using a second alignment pattern having electrode patterns that are displaced relative to corresponding current blocking patterns of said first alignment pattern in order to compensate for the displacement of said shaped portions relative to said current blocking portions due to a slow growth of said current diffusing layer on the (1 0 0) plane.

12. A method as claimed in claim 11, wherein said current diffusing layer comprises $Al_xGa_yIn_{1-x-y}P$ ($0 \leq x \leq 1$, $0 \leq y \leq 1$).

13. A method as claimed in claim 11, wherein the current diffusing layer is formed to a thickness d and each respective electrode is displaced relative to its corresponding shaped portion by $0.5 \times (d/\tan \theta)$ to $1.5 \times (d/\tan \theta)$.

14. A method as claimed in claim 11, wherein said semiconductor substrate is a GaAs substrate.

15. A method as claimed in claim 11, wherein said light emitting layer comprises one or more layers of $Al_xGa_yIn_{1-x-y}P$ ($0 \leq x \leq 1$, $0 \leq y \leq 1$).

16. A method as claimed in claim 11, wherein said current diffusing layer comprises GaP.

17. A method as claimed in claim 11, wherein an edge of each respective electrode is aligned with a corresponding edge of its corresponding shaped portion.

18. A method of fabricating a light emitting diode, comprising the steps of:

forming a light emitting layer over a top surface of a semiconductor substrate of a first conductivity type, the top surface of said semiconductor substrate being inclined at an angle $\theta$ with respect to the (1 0 0) plane of said semiconductor substrate;

forming a current blocking layer of the first conductivity type over said light emitting layer;

forming a first current diffusing layer of a second conductivity type over said current blocking layer;

etching said first current diffusing layer and said current blocking layer to form openings, each said opening being larger at an upper portion thereof than at a lower portion thereof;

forming a second current diffusing layer that fills in said openings and covers the remaining portions of said first current diffusing layer, said second current diffusing layer including channel traces caused by the openings etched in said first current diffusing layer and said current blocking layer; and forming an electrode on said second current diffusing layer, said electrode comprising first electrode portions arranged in the channel traces in said second current diffusing layer.

* * * * *